US012763294B2

(12) United States Patent
Aramaki et al.

(10) Patent No.: US 12,763,294 B2
(45) Date of Patent: Oct. 13, 2026

(54) PLASMA PROCESSING APPARATUS

(71) Applicant: Tokyo Electron Limited, Tokyo (JP)

(72) Inventors: Takashi Aramaki, Kurokawa-gun (JP); Lifu Li, Kurokawa-gun (JP); Hiroshi Tsujimoto, Kurokawagun (JP)

(73) Assignee: Tokyo Electron Limited, Tokyo (JP)

( * ) Notice: Subject to any disclaimer, the term of this patent is extended or adjusted under 35 U.S.C. 154(b) by 397 days.

(21) Appl. No.: 18/541,526

(22) Filed: Dec. 15, 2023

(65) Prior Publication Data

US 2024/0222090 A1 Jul. 4, 2024

(30) Foreign Application Priority Data

Dec. 28, 2022 (JP) ................................ 2022-211747

(51) Int. Cl.
*H01J 37/32* (2006.01)

(52) U.S. Cl.
CPC .. *H01J 37/32715* (2013.01); *H01J 37/32568* (2013.01); *H01J 37/32091* (2013.01); *H01J 2237/2007* (2013.01)

(58) Field of Classification Search
CPC ........... H01J 37/32541; H01J 37/32568; H01J 37/32532
See application file for complete search history.

(56) References Cited

U.S. PATENT DOCUMENTS 4,599,572 A * 7/1986 Nakayama .......... H03F 3/45071 330/69
5,909,137 A * 6/1999 Kimura .................... G06G 7/14 327/359
6,348,818 B1 * 2/2002 Filipovski .............. H05B 45/37 326/88
2009/0237140 A1 * 9/2009 Pae .......................... G06G 7/14 327/361
2011/0096461 A1 * 4/2011 Yoshikawa ........... H10P 72/722 361/234
2011/0140941 A1 * 6/2011 Tsuji .................. H03F 3/45475 341/144

(Continued)

FOREIGN PATENT DOCUMENTS

| | | |
|---|---|---|
| JP | 2011-035266 A | 2/2011 |
| JP | 2021-158134 A | 10/2021 |
| JP | 2022-184788 A | 12/2022 |

*Primary Examiner* — Matthew J Daniels
(74) *Attorney, Agent, or Firm* — PROCOPIO, CORY, HARGREAVES & SAVITCH LLP

(57) ABSTRACT

The purpose of the present disclosure is to provide a plasma processing apparatus including: a plasma processing chamber; a first bias electrode disposed in an electrostatic chuck to have a first outer diameter; a second bias electrode disposed in the electrostatic chuck to have a second outer diameter; a third bias electrode disposed in the electrostatic chuck to have a third outer diameter; a first DC power supply; a second DC power supply; a third DC power supply; a voltage adder; a first voltage pulse generator electrically connected to the first bias electrode and configured to generate a first voltage pulse signal; a second voltage pulse generator electrically connected to the second bias electrode and configured to generate a second voltage pulse signal; and a third voltage pulse generator electrically connected to the third bias electrode and configured to generate a third voltage pulse signal.

14 Claims, 10 Drawing Sheets

(56) References Cited

U.S. PATENT DOCUMENTS

| | | | | |
|---|---|---|---|---|
| 2020/0402777 | A1* | 12/2020 | Sasaki ............... | H01J 37/32091 |
| 2021/0005427 | A1* | 1/2021 | Sawataishi ........ | H01J 37/32082 |
| 2022/0037119 | A1 | 2/2022 | Dorf et al. | |

* cited by examiner

PLASMA PROCESSING APPARATUS

CROSS-REFERENCE TO RELATED APPLICATION

The present application claims priority under 35 U.S.C. § 119 to Japanese Patent Application No. 2021-211747 filed on Dec. 28, 2022, the entire contents of which are incorporated herein by reference.

BACKGROUND

Field

An exemplary embodiment of the present disclosure relates to a plasma processing apparatus.

Description of Related Art

US2022/0037119A1 discloses a technique for supplying RF and applying pulse voltage to a plurality of electrodes in a plasma processing apparatus.

SUMMARY

A plasma processing apparatus in one exemplary embodiment of the present disclosure includes: a plasma processing chamber; a substrate support disposed in the plasma processing chamber, the substrate support including a base, an electrostatic chuck and an edge ring, the electrostatic chuck being disposed on the base and having a substrate support surface and a ring support surface, and the edge ring being disposed on the ring support surface to surround a substrate disposed on the substrate support surface; a substrate chuck electrode disposed below the substrate support surface in the electrostatic chuck; at least one ring chuck electrode disposed below the ring support surface in the electrostatic chuck; a first bias electrode disposed in the electrostatic chuck and having a first outer diameter; a second bias electrode disposed in the electrostatic chuck and having a second outer diameter greater than the first outer diameter: a third bias electrode disposed in the electrostatic chuck and having a third outer diameter greater than the second outer diameter; a first DC power supply configured to generate a first primary DC signal having a first primary voltage level; a second DC power supply configured to generate a second primary DC signal having a second primary voltage level; a third DC power supply configured to generate a third primary DC signal having a third primary voltage level; a voltage adder configured to generate first to third secondary DC signals from the first to third primary DC signals, the first secondary DC signal having a first secondary voltage level, the second secondary DC signal having a second secondary voltage level, the third secondary DC signal having a third secondary voltage level, wherein the first secondary voltage level, the second secondary voltage level, and the third secondary voltage level are selected not to overlap one another from the first primary voltage level, a voltage level derived by adding the first primary voltage level and the second primary voltage level, and a voltage level derived by adding the first primary voltage level and the third primary voltage level; a first voltage pulse generator electrically connected to the first bias electrode and configured to generate a first voltage pulse signal from the first secondary DC signal, the first voltage pulse signal having the first secondary voltage level; a second voltage pulse generator electrically connected to the second bias electrode and configured to generate a second voltage pulse signal from the second secondary DC signal, the second voltage pulse signal having the second secondary voltage level; and a third voltage pulse generator electrically connected to the third bias electrode and configured to generate a third voltage pulse signal from the third secondary DC signal, the third voltage pulse signal having the third secondary voltage level.

DETAILED DESCRIPTION

Figure 1:
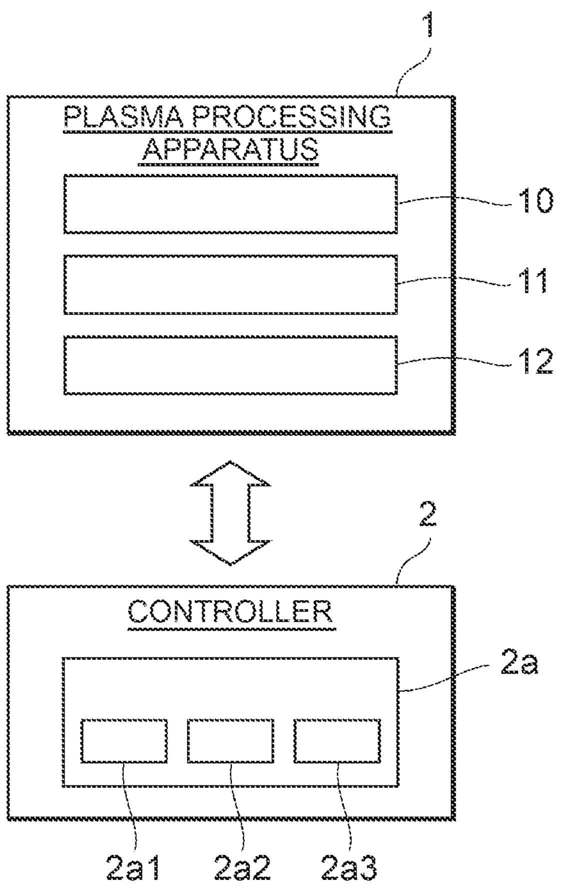
FIG. 1 is a diagram for illustrating a configuration example of a plasma processing system.

Each embodiment of the present disclosure will be described below.

In one exemplary embodiment, there is provided a plasma processing apparatus including: a plasma processing chamber; a substrate support disposed in the plasma processing chamber, the substrate support including a base, an electrostatic chuck and an edge ring, the electrostatic chuck being disposed on the base and having a substrate support surface and a ring support surface, and the edge ring being disposed on the ring support surface to surround a substrate disposed on the substrate support surface; a substrate chuck electrode disposed below the substrate support surface in the electrostatic chuck; at least one ring chuck electrode disposed below the ring support surface in the electrostatic chuck; a first bias electrode disposed in the electrostatic chuck and having a first outer diameter; a second bias electrode disposed in the electrostatic chuck and having a second outer diameter greater than the first outer diameter; a third bias electrode disposed in the electrostatic chuck and having a third outer diameter greater than the second outer diameter; a first DC power supply configured to generate a first primary DC signal having a first primary voltage level; a second DC power supply configured to generate a second primary DC signal having a second primary voltage level; a third DC power supply configured to generate a third primary DC signal having a third primary voltage level; a voltage adder configured to generate first to third secondary DC signals from the first to third primary DC signals, the first secondary DC signal having a first secondary voltage level, the second secondary DC signal having a second secondary voltage level, the third secondary DC signal having a third secondary voltage level, wherein the first secondary voltage level, the second secondary voltage level, and the third secondary voltage level are selected not to overlap one another from the first primary voltage level, a voltage level derived by adding the first primary voltage level and the second primary voltage level, and a voltage level derived by adding the first primary voltage level and the third primary voltage level; a first voltage pulse generator electrically connected to the first bias electrode and configured to generate a first voltage pulse signal from the first secondary DC signal, the first voltage pulse signal having the first secondary voltage level; a second voltage pulse generator electrically connected to the second bias electrode and configured to generate a second voltage pulse signal from the second secondary DC signal, the second voltage pulse signal having the second secondary voltage level: and a third voltage pulse generator electrically connected to the third bias electrode and configured to generate a third voltage pulse signal from the third secondary DC signal, the third voltage pulse signal having the third secondary voltage level.

In one exemplary embodiment, the first voltage pulse signal contains a sequence of first voltage pulses, the second voltage pulse signal, contains a sequence of second voltage pulses, and the third voltage pulse signal contains a sequence of third voltage pulses.

In one exemplary embodiment, the first primary voltage level, the second primary voltage level, and the third primary voltage level have negative polarity.

In one exemplary embodiment, the absolute value of the first primary voltage level is greater than the absolute values of the second primary voltage level and the third primary voltage level.

In one exemplary embodiment, the first bias electrode is disposed to overlap vertically with the substrate support surface, the second bias electrode is disposed to overlap vertically with the substrate support surface and the ring support surface, and the third bias electrode is disposed to overlap vertically with the ring support surface.

In one exemplary embodiment, the first bias electrode is disposed to overlap vertically with the substrate support surface, the second bias electrode is disposed to overlap vertically with the substrate support surface, and the third bias electrode is disposed to overlap vertically with the ring support surface.

In one exemplary embodiment, the first bias electrode is disposed to overlap vertically with the substrate support surface, the second bias electrode is disposed to overlap vertically with the substrate support surface, and the third bias electrode is disposed to overlap vertically with the substrate support surface and the ring support surface.

In one exemplary embodiment, the first bias electrode is disposed to overlap vertically with the substrate support surface, the second bias electrode is disposed to overlap vertically with the substrate support surface, and the third bias electrode is disposed to overlap vertically with the substrate support surface.

In one exemplary embodiment, the first bias electrode, the second bias electrode, and the third bias electrode are disposed at the same height.

In one exemplary embodiment, the first bias electrode, the second bias electrode, and the third bias electrode are disposed at heights different from one another.

In one exemplary embodiment, the second bias electrode is disposed at a position lower than the first bias electrode, and the third bias electrode is disposed at a position lower than the second bias electrode.

In one exemplary embodiment, an outer edge area of the first bias electrode overlaps vertically with an inner edge area of the second bias electrode, and an outer edge area of the second bias electrode overlaps vertically with an inner edge area of the third bias electrode.

In one exemplary embodiment, the ring chuck electrode includes an inner ring chuck electrode to which a first ring chuck voltage having a first polarity is applied, and an outer ring chuck electrode to which a second ring chuck voltage having a second polarity is applied.

In one exemplary embodiment, there is provided a plasma processing apparatus including: a plasma processing chamber: a substrate support disposed in the plasma processing chamber, the substrate support including a base, an electrostatic chuck and an edge ring, the electrostatic chuck being disposed on the base and having a substrate support surface and a ring support surface, and the edge ring being disposed on the ring support surface to surround a substrate on the substrate support surface; a substrate chuck electrode disposed below the substrate support surface in the electrostatic chuck; at least one ring chuck electrode disposed below the ring support surface in the electrostatic chuck; a first bias electrode disposed in the electrostatic chuck and having a first outer diameter; a second bias electrode disposed in the electrostatic chuck and having a second outer diameter greater than the first outer diameter: a third bias electrode disposed in the electrostatic chuck and having a third outer diameter greater than the second outer diameter; a first voltage pulse generator electrically connected to the first bias electrode and configured to generate a first voltage pulse signal having a first voltage level; a second voltage pulse generator electrically connected to the second bias electrode and configured to generate a second voltage pulse signal having a second voltage level: and a third voltage pulse generator electrically connected to the third bias electrode and configured to generate a third voltage pulse signal having a third voltage level.

In one exemplary embodiment, the plasma processing apparatus further includes: a first DC power supply configured to supply a first DC signal having the first voltage level to the first voltage pulse generator; a second DC power supply configured to supply a second DC signal having the second voltage level to the second voltage pulse generator; and a third DC power supply configured to supply a third DC signal having the third voltage level to the third voltage pulse generator.

In one exemplary embodiment, the first voltage level, the second voltage level, and the third voltage level have negative polarity.

In one exemplary embodiment, the first bias electrode is disposed to overlap vertically with the substrate support surface, the second bias electrode is disposed to overlap vertically with the substrate support surface, and the third bias electrode is disposed to overlap vertically with the ring support surface.

In one exemplary embodiment, the second bias electrode is disposed at a position lower than the first bias electrode, and the third bias electrode is disposed at a position lower than the second bias electrode.

In one exemplary embodiment, an outer edge area of the first bias electrode overlaps vertically with an inner edge area of the second bias electrode, and an outer edge area of the second bias electrode overlaps vertically with an inner edge area of the third bias electrode.

In one exemplary embodiment, there is provided a plasma processing apparatus including: a plasma processing chamber; a substrate support disposed in the plasma processing chamber, the substrate support including a base, an electrostatic chuck and an edge ring, the electrostatic chuck being disposed on the base and having a substrate support surface and a ring support surface, and the edge ring being disposed on the ring support surface to surround a substrate disposed on the substrate support surface; a substrate chuck electrode disposed below the substrate support surface in the electrostatic chuck; at least one ring chuck electrode disposed below the ring support surface in the electrostatic chuck; a first bias electrode disposed in the electrostatic chuck and having a first outer diameter; a second bias electrode disposed in the electrostatic chuck and having a second outer diameter greater than the first outer diameter; a third bias electrode disposed in the electrostatic chuck and having a third outer diameter greater than the second outer diameter; a first DC power supply configured to generate a first DC signal having a first voltage level: a second DC power supply configured to generate a second DC signal having a second voltage level; a third DC power supply configured to generate a third DC signal having a third voltage level: a first voltage pulse generator electrically connected to the first bias electrode and configured to generate a first voltage pulse signal having the first voltage level: a second voltage pulse generator electrically connected to the second bias electrode and configured to generate a second voltage pulse signal having a fourth voltage level, the fourth voltage level being a sum of the first voltage level and the second voltage level; and a third voltage pulse generator electrically connected to the third bias electrode and configured to generate a third voltage pulse signal having a fifth voltage level, the fifth voltage level being a sum of the first voltage level, the second voltage level, and the third voltage level.

Each embodiment of the present disclosure will be described in detail below with reference to the accompanying drawings. Note that the same or similar elements in respective drawings are given the same reference numerals to omit duplicate description. The positional relationships such as up, down, left, and right will be described based on the positional relationships illustrated in the drawings unless otherwise specified. The drawing dimension ratio does not illustrate an actual dimension ratio, and the actual ratio is not limited to the ratio illustrated in the drawings.

One Example of Plasma Processing Apparatus

Hereinafter, an example of the configuration example of a plasma processing system will be described. FIG. 1 is a view for explaining an example of a configuration of a capacitively-coupled plasma processing apparatus.

The plasma processing system includes a capacitively-coupled plasma processing apparatus 1 and a controller 2. The capacitively-coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a showerhead 13. The substrate support 11 is disposed in the plasma processing chamber 10. The showerhead 13 is disposed above the substrate support 11. In one embodiment, the showerhead 13 constitutes at least a part of a ceiling of the plasma processing chamber 10. The plasma processing chamber 10 has a plasma processing space 10*s* defined by the showerhead 13, a sidewall 10*a* of the plasma processing chamber 10, and the substrate support 11. The plasma processing chamber 10 has at least one gas supply port for supplying at least one processing gas into the plasma processing space 10*s*, and at least one gas exhaust port for exhausting the gas from the plasma processing space. The plasma processing chamber 10 is grounded. The showerhead 13 and the substrate support 11 are electrically insulated from a housing of the plasma processing chamber 10.

The substrate support 11 includes a main body 111 and a ring assembly 112. The main body portion 111 has a central region 111*a* for supporting the substrate W and an annular region 111*b* for supporting the ring assembly 112. The wafer is an example of the substrate W. The annular region 111*b* of the main body 111 surrounds the central region 111*a* of the main body 111 in a plan view. The substrate W is disposed on the central region 111*a* of the main body 111 and the ring assembly 112 is disposed on the annular region 111*b* of the main body 111 to surround the substrate W on the central region 111*a* of the main body 111. Accordingly, the central region 111*a* is also referred to as a substrate support surface for supporting the substrate W, and the annular region 111*b* is also referred to as a ring support surface for supporting the ring assembly 112.

In one embodiment, the main body 111 includes a base 1110 and an electrostatic chuck 1111. The base 1110 includes a conductive member. The conductive member of the base 1110 functions as a lower electrode. The electrostatic chuck 1111 is disposed on the base 1110. The electrostatic chuck 1111 includes a ceramic member 1111*a* and an electrostatic electrode 1111*b* disposed in the ceramic member 1111*a*. The ceramic member 1111*a* has a central region 111*a*. In one embodiment, the ceramic member 1111*a* also has an annular region 111*b*. Other members that surround the electrostatic chuck 1111, such as an annular electrostatic chuck and an annular insulating member, may have the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power source 31 and/or a direct current (DC) power source 32 to be described below may be disposed inside the ceramic member 1111*a*. In this case, at least one RF/DC electrode functions as the lower electrode. In a case where the bias RF signal and/or the DC signal to be described later are supplied to at least one RF/DC electrode, the RF/DC electrode is also referred to as a bias electrode. The conductive member of the base 1110 and at least one RF/DC electrode may function as a plurality of lower electrodes. Further, the electrostatic electrode 1111*b* may function as the lower electrode. Accordingly, the substrate support 11 includes at least one lower electrode.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a flow path 1110$a$, or a combination thereof. A heat transfer fluid, such as brine or gas, flows through the flow path 1110$a$. In one embodiment, the flow path 1110$a$ is formed inside the base 1110, and one or more heaters are disposed in the ceramic member 1111$a$ of the electrostatic chuck 1111. Further, the substrate support 11 may include a heat transfer gas supply configured to supply a heat transfer gas to a gap between the rear surface of the substrate W and the central region 111$a$.

The showerhead 13 is configured to introduce at least one processing gas from the gas supply 20 into the plasma processing space 10$s$. The showerhead 13 has at least one gas supply port 13$a$, at least one gas diffusion chamber 13$b$, and a plurality of gas introduction ports 13$c$. The processing gas supplied to the gas supply port 13$a$ passes through the gas diffusion chamber 13$b$ and is introduced into the plasma processing space 10$s$ from the plurality of gas introduction ports 13$c$. Further, the showerhead 13 includes at least one upper electrode. The gas introduction unit may include, in addition to the showerhead 13, one or a plurality of side gas injectors (SGI) that are attached to one or a plurality of openings formed in the sidewall 10$a$.

The gas supply 20 may include at least one gas source 21 and at least one flow controller 22. In one embodiment, the gas supply 20 is configured to supply at least one processing gas from the respective corresponding gas sources 21 to the showerhead 13 via the respective corresponding flow controllers 22. Each flow controller 22 may include, for example, a mass flow controller or a pressure-controlled flow controller. Further, the gas supply 20 may include one or more flow modulation devices that modulate or pulse flow rates of at least one processing gas.

The power source 30 includes an RF power source 31 coupled to plasma processing chamber 10 via at least one impedance matching circuit. The RF power source 31 is configured to supply at least one RF signal (RF power) to at least one lower electrode and/or at least one upper electrode. As a result, a plasma is formed from at least one processing gas supplied into the plasma processing space 10$s$. Accordingly, the RF power source 31 may function as at least a portion of a plasma generator configured to generate a plasma from one or more processing gases in the plasma processing chamber 10. Further, by supplying the bias RF signal (bias signal) to the at least one lower electrode, a bias potential (bias power) is generated in the substrate W, making it possible to draw ion components in the formed plasma into the substrate W.

In one embodiment, the RF power source 31 includes a first RF generator 31$a$ and a second RF generator 31$b$. The first RF generator 31$a$ is configured to be coupled to at least one lower electrode and/or at least one upper electrode via at least one impedance matching circuit to generate a source RF signal (source RF power) for plasma generation. In one embodiment, the source RF signal has a frequency in the range of 10 MHz to 150 MHz. In one embodiment, the first RF generator 31$a$ may be configured to generate a plurality of source RF signals having different frequencies. The generated one or more source RF signals are supplied to at least one lower electrode and/or at least one upper electrode.

The second RF generator 31$b$ is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31$b$ may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32$a$ and a second DC generator 32$b$. In one embodiment, the first DC generator 32$a$ is configured to be connected to at least one lower electrode to generate the first DC signal. The generated first bias DC signal is applied to at least one lower electrode. In one embodiment, the second DC generator 32$b$ is configured to be connected to at least one upper electrode to generate a second DC signal. The generated second DC signal is applied to at least one upper electrode.

In various embodiments, at least one of the first and second DC signals may be pulsed. In this case, the sequence of voltage pulses is applied to at least one lower electrode and/or at least one upper electrode. The voltage pulse may have a pulse waveform of a rectangle, a trapezoid, a triangle or a combination thereof. In one embodiment, a waveform generator for generating a sequence of voltage pulses from the DC signal is connected between the first DC generator 32$a$ and at least one lower electrode. Accordingly, the first DC generator 32$a$ and the waveform generator configure a voltage pulse generator. In a case where the second DC generator 32$b$ and the waveform generator configure the voltage pulse generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32$a$ and 32$b$ may be provided in addition to the RF power source 31, and the first DC generator 32$a$ may be provided instead of the second RF generator 31$b$.

The exhaust system 40 may be connected to, for example, a gas exhaust port 10$e$ disposed at a bottom portion of the plasma processing chamber 10. The exhaust system 40 may include a pressure adjusting valve and a vacuum pump. The pressure in the plasma processing space 10$s$ is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include a processor 2$a$1, a storage unit 2$a$2, and a communication interface 2$a$3. The controller 2 is implemented by, for example, a computer 2$a$. The processor 2$a$1 may be configured to read a program from the storage unit 2$a$2 and perform various control operations by executing the read program. The program may be stored in advance in the storage unit 2$a$2, or may be acquired via a medium when necessary. The acquired program is stored in the storage unit 2$a$2, and is read from the storage unit 2$a$2 and executed by the processor 2$a$1. The medium may be various storing media readable by the computer 2$a$, or may be a communication line connected to the communication interface 2*a*3. The processor 2*a*1 may be a Central Processing Unit (CPU). The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

First Exemplary Embodiment

Figure 3:
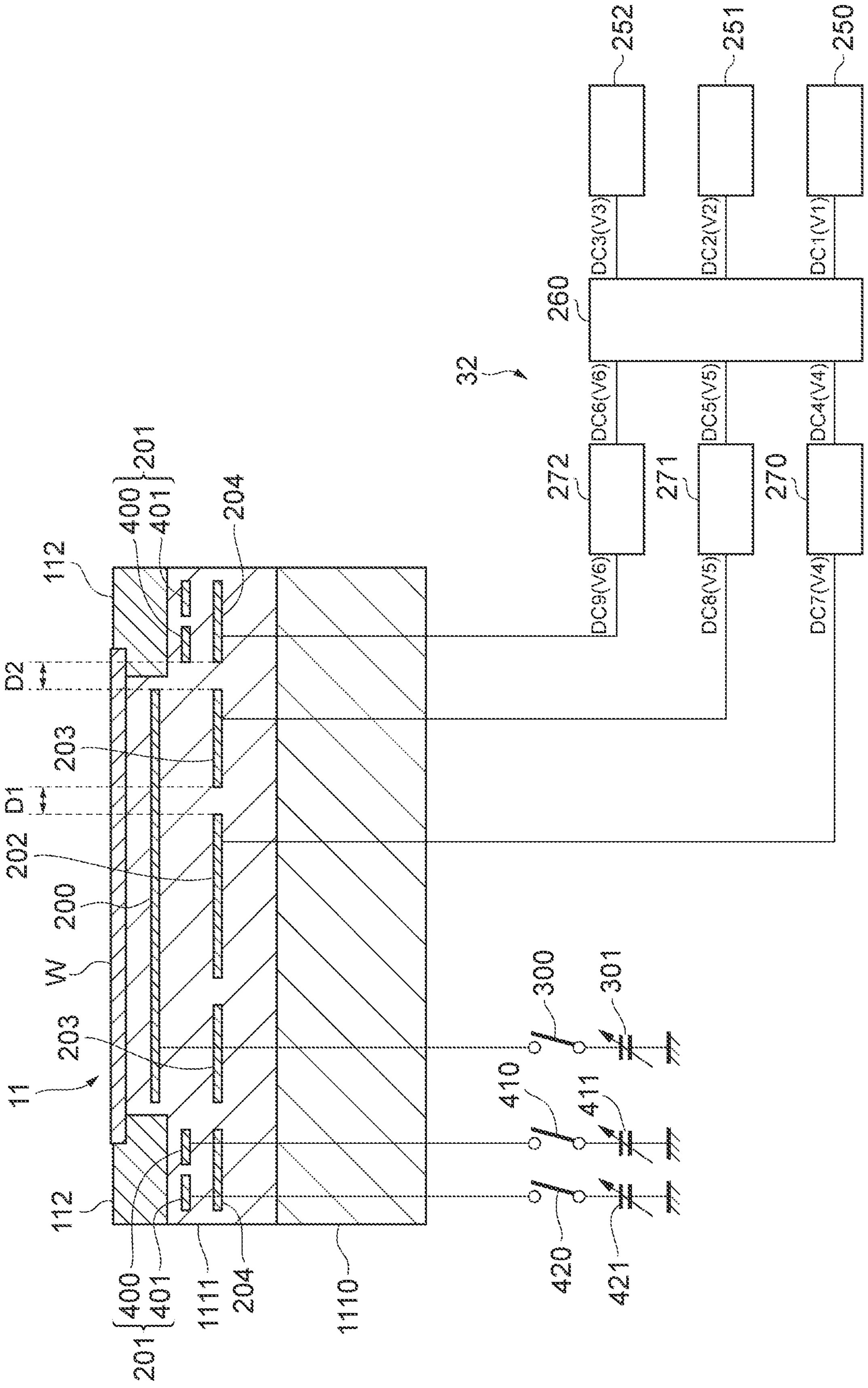
FIG. 3 is a diagram for illustrating a configuration example of a substrate support and DC power supplies in a first exemplary embodiment.

A first exemplary embodiment of the above plasma processing apparatus 1 will be described. FIG. 3 is a diagram illustrating a configuration example of the substrate support 11 and the DC power supply 32 in the first exemplary embodiment. In one embodiment, the substrate support 11 has a substrate chuck electrode 200, a ring chuck electrode 201, a first bias electrode 202, a second bias electrode 203, and a third bias electrode 204 in the electrostatic chuck 1111. The substrate chuck electrode 200 and the ring chuck electrode 201 may be an example of the electrostatic electrode 1111*b*.

In one embodiment, the DC power supply 32 includes a first DC power supply 250, a second DC power supply 251, a third DC power supply 252, a voltage adder 260, a first voltage pulse generator 270, a second voltage pulse generator 271, and a third voltage pulse generator 272.

The substrate chuck electrode 200 can be disposed below the substrate support surface in the electrostatic chuck 1111. In one embodiment, the substrate chuck electrode 200 has a circular shape. In one embodiment, the substrate chuck electrode 200 is connected to a direct current (DC) power supply 301 through a switch 300. When a DC voltage from the DC power supply 301 is applied to the substrate chuck electrode 200, electrostatic attraction (Coulomb force) occurs between the substrate chuck electrode 200 and the substrate W. The substrate W is attracted to the electrostatic chuck 1111 by the electrostatic attraction, absorbed into and held in the substrate support surface.

In one embodiment, the ring chuck electrode 201 can be disposed below the ring support surface in the electrostatic chuck 1111. In one embodiment, the ring chuck electrode 201 includes an inner ring chuck electrode 400 and an outer ring chuck electrode 401. In one embodiment, the inner ring chuck electrode 400 is connected to a DC power supply 411 through a switch 410. In one embodiment, the outer ring chuck electrode 401 is disposed outside of the inner ring chuck electrode 400. In one embodiment, the outer ring chuck electrode 401 is connected to a DC power supply 421 through a switch 420. In one embodiment, a potential difference occurs between the inner ring chuck electrode 400 and the outer ring chuck electrode 401 in the ring chuck electrode 201 to cause the ring assembly 112 to be absorbed into and held in the ring support surface by the potential difference. In one embodiment, the polarity of a first ring chuck voltage applied to the inner ring chuck electrode 400 is different from the polarity of a second ring chuck voltage applied to the outer ring chuck electrode 401.

Figure 4:
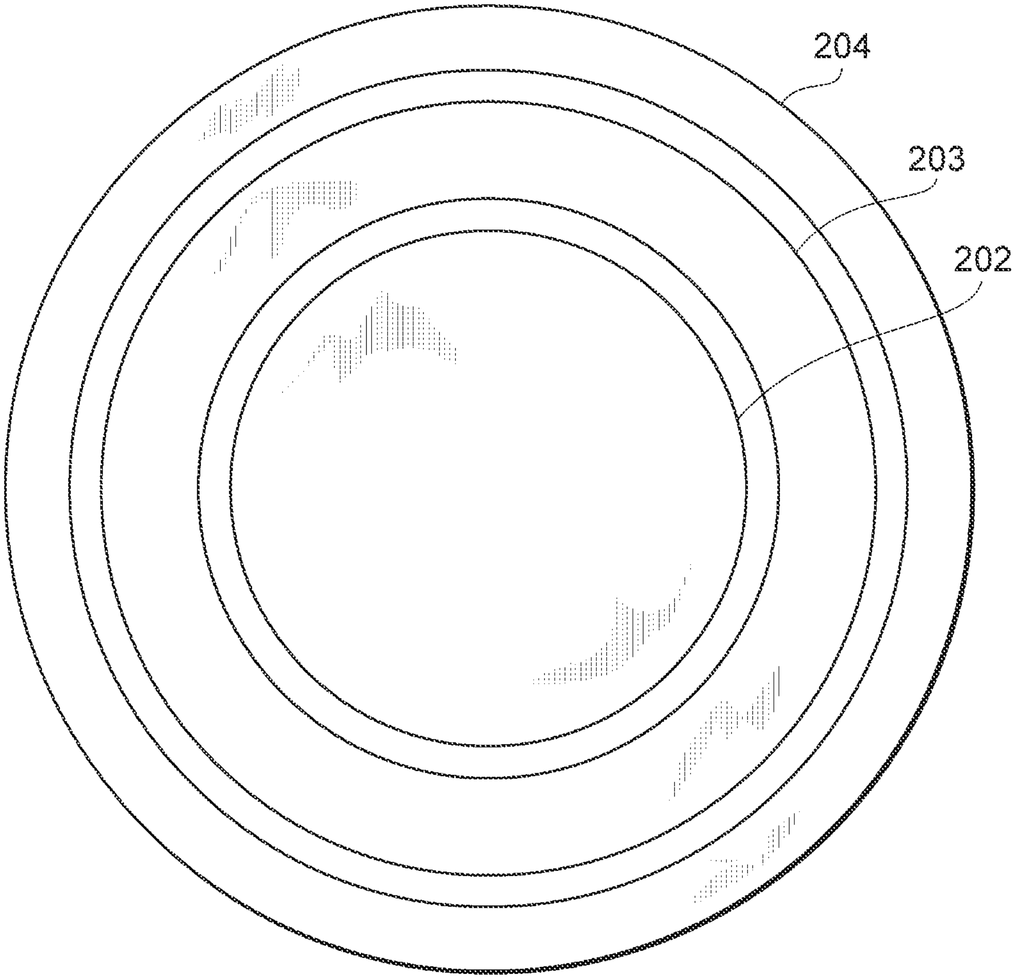
FIG. 4 is a diagram for illustrating a configuration example of bias electrodes in plan view.

In one embodiment, the first bias electrode 202 and the second bias electrode 203 can be disposed below the substrate support surface to overlap vertically with the substrate support surface in the electrostatic chuck 1111. The third bias electrode 204 can be disposed below the ring support surface to overlap vertically with the ring support surface in the electrostatic chuck 1111. As illustrated in FIG. 4, the first bias electrode 202 has a circular shape in one embodiment. In one embodiment, each of the second bias electrode 203 and the third bias electrode 204 has an annular shape having a width in the radial direction. In one embodiment, the second bias electrode 203 is greater in diameter than the first bias electrode 202, and is disposed outside of the first bias electrode 202. In one embodiment, the third bias electrode 204 is greater in diameter than the second bias electrode 203, and is disposed outside of the second bias electrode 203.

As illustrated in FIG. 3, the first bias electrode 202, the second bias electrode 203, and the third bias electrode 204 may also be disposed at the same height. The first bias electrode 202 and the second bias electrode 203 may be separated by distance D1 or more. The second bias electrode 203 and the third bias electrode 204 may be separated by distance D2 or more.

The first DC power supply 250 can generate a first primary DC signal DC1 having a first primary voltage level V1. The first primary voltage level V1 may have negative polarity. The first DC power supply 250 is electrically connected to the voltage adder 260. The generated first primary DC signal DC1 can be supplied to the voltage adder 260.

The second DC power supply 251 can generate a second primary DC signal DC2 having a second primary voltage level V2. The second primary voltage level V2 may have negative polarity. The second DC power supply 251 is electrically connected to the voltage adder 260. The generated second primary DC signal DC2 can be supplied to the voltage adder 260.

The third DC power supply 252 can generate a third primary DC signal DC3 having a third primary voltage level V3. The third primary voltage level V3 may have negative polarity. The third DC power supply 252 is electrically connected to the voltage adder 260. The generated third primary DC signal DC3 can be supplied to the voltage adder 260. In one embodiment, the first primary voltage level V1 is greater than the second primary voltage level V2 and the third primary voltage level V3. In one embodiment, the absolute value of the first primary voltage level V1 is five times or more as large as the absolute value of the second primary voltage level V2 and the absolute value of the third primary voltage level V3.

From the voltage levels V1 to V3 of the first to third primary DC signals DC1 to DC3, the voltage adder 260 can generate a first secondary DC signal DC4 having a first secondary voltage level V4, a second secondary DC signal DC5 having a second secondary voltage level V5, and a third secondary DC signal DC6 having a third secondary voltage level V6.

The first secondary voltage level V4 of the first secondary DC signal DC4, the second secondary voltage level V5 of the second secondary DC signal DC5, and the third secondary voltage level V6 of the third secondary DC signal DC6 are selected from (1) to (3) below so as not to overlap one another.

(1) Voltage level (V1) same as the first primary voltage level V1

(2) Voltage level (V1+V2) derived by adding the first primary voltage level V1 and the second primary voltage level V2

(3) Voltage level (V1+V3) derived by adding the first primary voltage level V1 and the third primary voltage level V3

In other words, when the first secondary voltage level V4 is the voltage level V1 (1), the second secondary voltage level V5 or the third secondary voltage level V6 becomes the voltage level (V1+V2) (2), and the remaining one of the second secondary voltage level V5 and the third secondary voltage level V6 becomes the voltage level (V1+V3) (3). When the second secondary voltage level V5 is the voltage level V1 (1), the first secondary voltage level V4 or the third secondary voltage level V6 becomes the voltage level (V1+V2) (2), and the remaining one of the first secondary voltage level V4 and the third secondary voltage level V6 becomes the voltage level (V1+V3) (3). When the third secondary voltage level V6 is the voltage level V1 (1), the first secondary voltage level V4 or the second secondary voltage level V5 becomes the voltage level (V1+V2) (2), and the remaining one of the first secondary voltage level V4 and the second secondary voltage level V5 becomes the voltage level (V1+V3) (3). Thus, each of the first secondary voltage level V4, the second secondary voltage level V5, and the third secondary voltage level V6 Is exclusively one of (1) to (3) mentioned above.

The voltage adder 260 is electrically connected to the first voltage pulse generator 270, the second voltage pulse generator 271, and the third voltage pulse generator 272. The first secondary DC signal DC4 generated by the voltage adder 260 can be supplied to the first voltage pulse generator 270, the second secondary DC signal DC5 can be supplied to the second voltage pulse generator 271, and the third secondary DC signal DC6 can be supplied to the third voltage pulse generator 272.

The first voltage pulse generator 270 can generate a first voltage pulse signal DC7 having the first secondary voltage level V4 from the first secondary DC signal DC4 supplied from the voltage adder 260. The first voltage pulse signal DC7 can contain a sequence of first voltage pulses. The first voltage pulse generator 270 is electrically connected to the first bias electrode 202. The generated first voltage pulse signal DC7 can be supplied to the first bias electrode 202. A bias pulse signal based on DC voltage is generated by supplying the first voltage pulse signal DC7 to the first bias electrode 202 to make it possible to draw ion components in the plasma formed on the substrate W of the substrate support 11 into the side of the first bias electrode 202.

The second voltage pulse generator 271 can generate a second voltage pulse signal DC8 having the second secondary voltage level V5 from the second secondary DC signal DC5 supplied from the voltage adder 260. The second voltage pulse signal DC8 can contain a sequence of second voltage pulses. The second voltage pulse generator 271 is electrically connected to the second bias electrode 203. The generated second voltage pulse signal DC3 can be supplied to the second bias electrode 203. A bias pulse signal based on DC voltage is generated by supplying the second voltage pulse signal DC8 to the second bias electrode 203 to make it possible to draw the ion components in the plasma formed on the substrate W of the substrate support 11 into the side of the second bias electrode 203.

The third voltage pulse generator 272 can generate a third voltage pulse signal DC9 having the third secondary voltage level V6 from the third secondary DC signal DC6 supplied from the voltage adder 260. The third voltage pulse signal DC09 can contain a sequence of third voltage pulses. The third voltage pulse generator 272 is electrically connected to the third bias electrode 204. The generated third voltage pulse signal DC9 can be supplied to the third bias electrode 204. A bias pulse signal based on DC voltage is generated by supplying the third voltage pulse signal DC9 to the third bias electrode 204 to make it possible to draw the ion components in the plasma formed on the substrate W of the substrate support 11 into the side of the third bias electrode 204.

Figure 5:
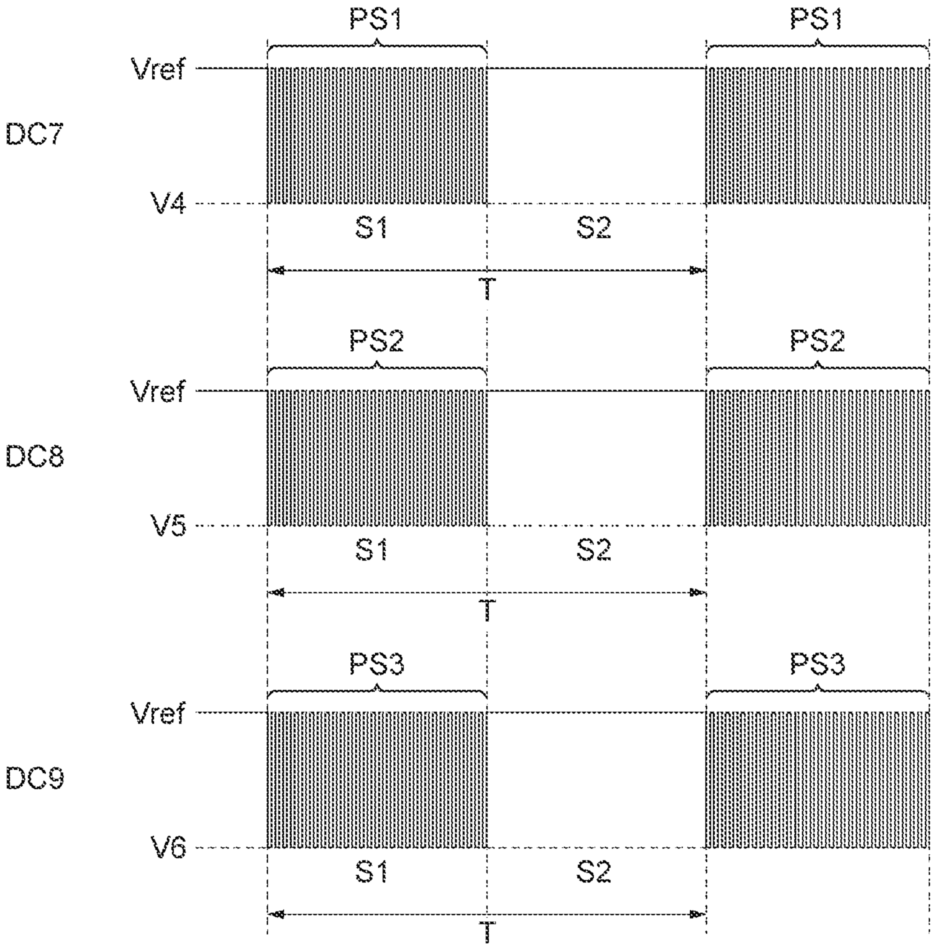
FIG. 5 is a diagram for illustrating an example of voltage pulses.

FIG. 5 illustrates an example of the first to third voltage pulse signals DC7 to DC9. The first voltage pulse signal DC7 can have voltage pulse sequence PS1 having the first secondary voltage level V4 during first state S1 in repeat period T, and have reference voltage level $V_{ref}$ continuously during second state S2 in the repeat period T. In other words, the first voltage pulse signal DC7 can be maintained at the reference voltage level $V_{ref}$ during second state S2. The absolute value of the reference voltage level $V_{ref}$ is smaller than the absolute value of the first secondary voltage level V4. In one embodiment, the first secondary voltage level V4 has negative polarity. In one embodiment, the reference voltage level $V_{ref}$ has zero voltage level.

The second voltage pulse signal DC8 can have voltage pulse sequence PS2 having the second secondary voltage level V5 during first state S1 in the repeat period T, and have reference voltage level $V_{ref}$ continuously during second state S2 in the repeat period T. In other words, the second voltage pulse signal DC8 can be maintained at the reference voltage level $V_{ref}$ during second state S2. The absolute value of the reference voltage level $V_{ref}$ is smaller than the absolute value of the second secondary voltage level V5. In one embodiment, the second secondary voltage level V5 has negative polarity, and the reference voltage level $V_{ref}$ has zero voltage level.

The third voltage pulse signal DC9 can have voltage pulse sequence PS3 having the third secondary voltage level V6 during first state S1 in the repeat period T, and have reference voltage level $V_{ref}$ continuously during second state S2 in the repeat period T. In other words, the third voltage pulse signal DC9 can be maintained at the reference voltage level $V_{ref}$ during second state S2. The absolute value of the reference voltage level $V_{ref}$ is smaller than the absolute value of the third secondary voltage level V6. In one embodiment, the third secondary voltage level V6 has negative polarity, and the reference voltage level $V_{ref}$ has zero voltage level.

In one embodiment, the absolute value of the third secondary voltage level V6 may also be greater than that of the second secondary voltage level V5, and the absolute value of the second secondary voltage level V5 may also be greater than that of the first secondary voltage level V4. The absolute value of the second secondary voltage level V5 may also be greater than those of the first secondary voltage level V4 and the third secondary voltage level V6. The magnitude among the first to third secondary voltage levels V4 to V6 may be so adjusted that a plasma sheath formed on the substrate gets closer to the substrate in parallel.

One Example of Plasma Processing Method

A plasma processing method includes etching processing for etching a film on the substrate W using the plasma. In one embodiment, the plasma processing method is executed by the controller 2 in the plasma processing apparatus 1.

Figure 2:
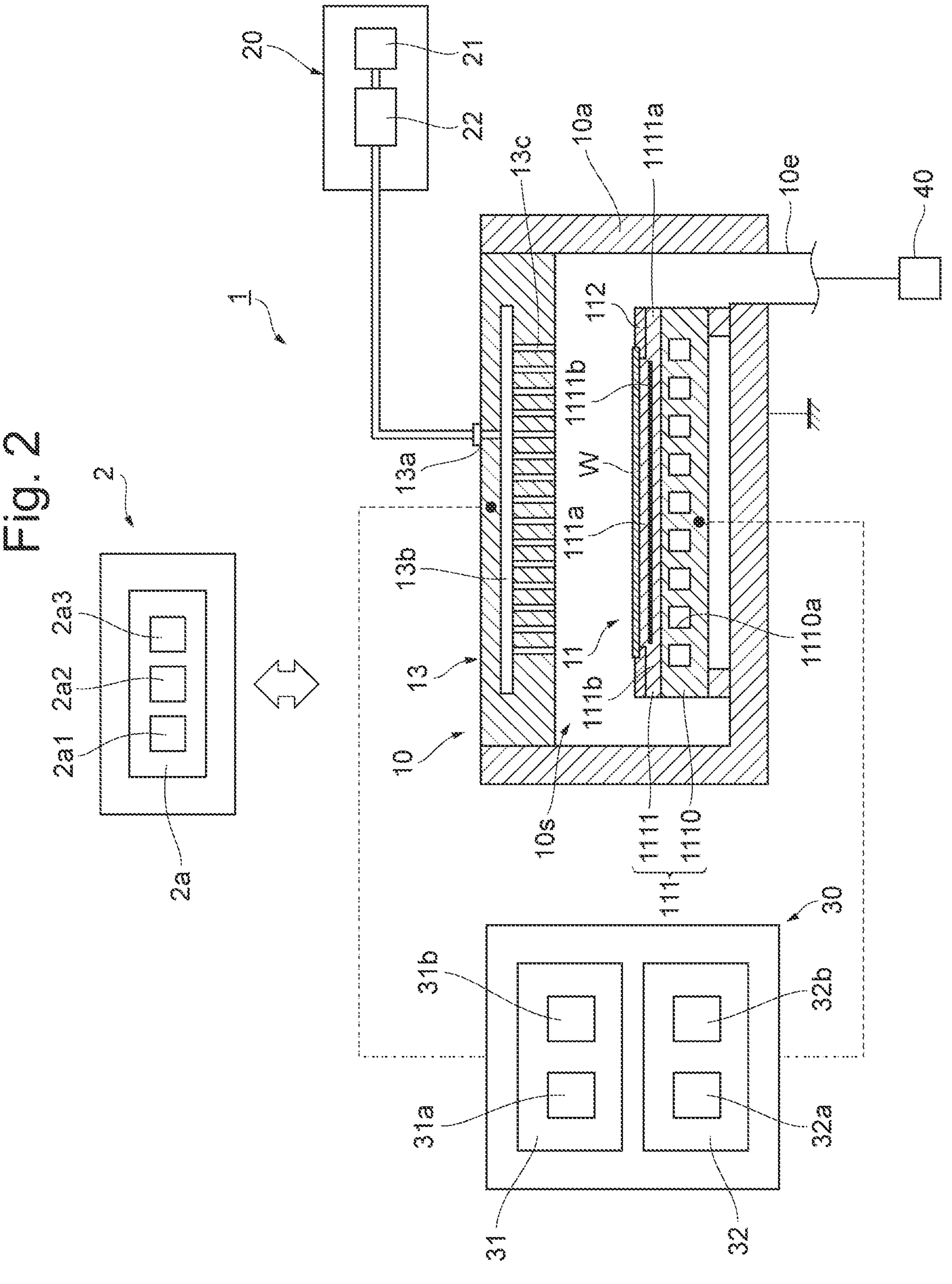
FIG. 2 is a diagram for illustrating a configuration example of a capacitively-coupled plasma processing apparatus.

First, the substrate W is carried into the chamber 10 by a transfer arm, placed on the substrate support 11 by a lifter, and held by suction on the substrate support 11 as illustrated in FIG. 2.

Next, a process gas is supplied to the showerhead 13 by the gas supply 20, and supplied from the showerhead 13 into the plasma processing space 10*s*. The process gas supplied at this time contains gases for generating active species necessary for the etching processing of the substrate W.

One or more RF signals are supplied from the RF power source 31 to the upper electrode and/or the lower electrode. The atmosphere in the plasma processing space 10*s* may be exhausted from the gas exhaust port 10*e* and the inside of the plasma processing space 10*s* may be depressurized. Thus, the plasma is formed on the substrate support 11 of the plasma processing space 10*s* to etch the substrate W.

Figure 6:
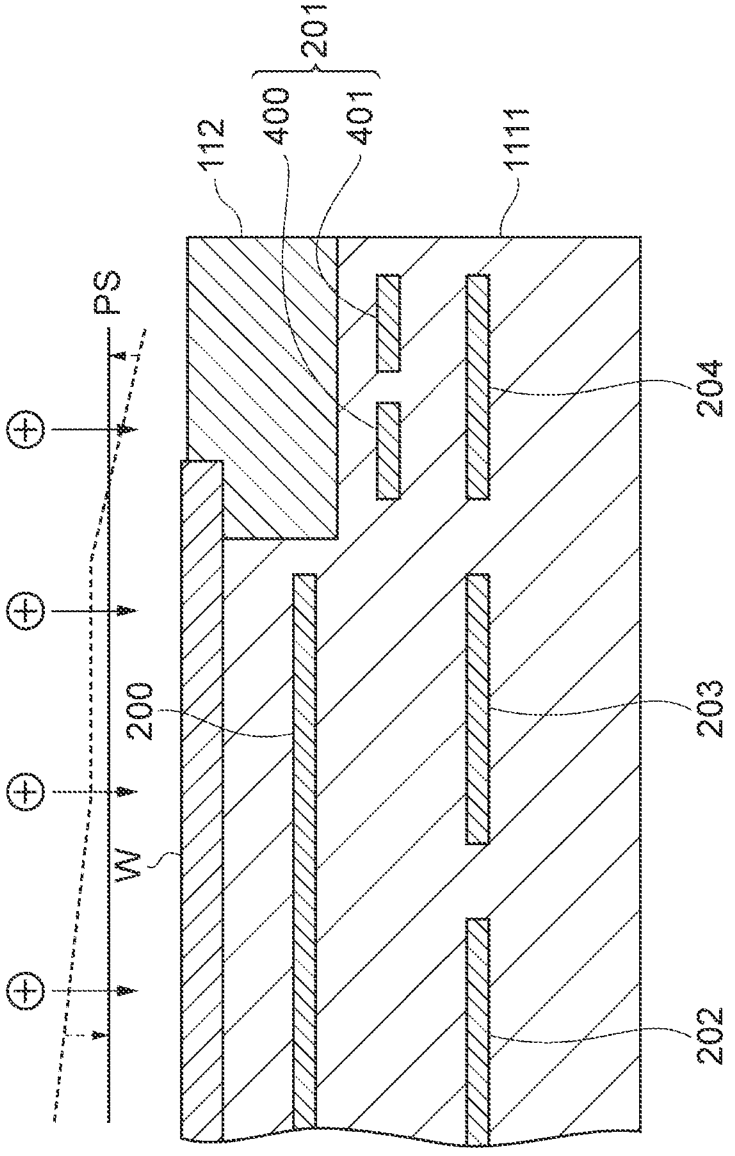
FIG. 6 is a diagram for illustrating a fluctuation of a plasma sheath on a substrate.

Upon forming the plasma, the first voltage pulse signal DC7 is supplied from the first voltage pulse generator 270 to the first bias electrode 202, the second voltage pulse signal DC8 is supplied from the second voltage pulse generator 271 to the second bias electrode 203, and the third voltage pulse signal DC9 is supplied from the third voltage pulse generator 272 to the third bias electrode 204 as illustrated in FIG. 3. Thus, a bias potential based on the voltage pulses is generated in the substrate W and the ring assembly 112, and the ion components in the plasma on the substrate W are drawn into the side of the substrate W. At this time, plasma sheath PS formed above the substrate W and the ring assembly 112 is made to get closer to the substrate W in parallel (horizontally) as illustrated in FIG. 6 by adjusting the first to third secondary voltage levels V4 to V6 of the first to third voltage pulse signals DC7 to DC9 and applying DC voltage to the first to third bias electrodes 202 to 204, respectively. Thus, the angle at which the ion components in the plasma enter into the substrate W in the plane of the substrate W (ion incidence angle) gets closer vertically to the substrate W.

According to the present exemplary embodiment, the plasma processing apparatus 1 includes the first bias electrode 202, the second bias electrode 203, the third bias electrode 204, the first DC power supply 250, the second DC power supply 251, the third DC power supply 252, the voltage adder 260, the first voltage pulse generator 270, the second voltage pulse generator 271, and the third voltage pulse generator 272. Thus, for example, the ion incidence angle in the plane of the substrate W can be controlled in the plasma processing. As a result, in-plane uniformity of the substrate can be improved in the plasma processing.

Figure 7:
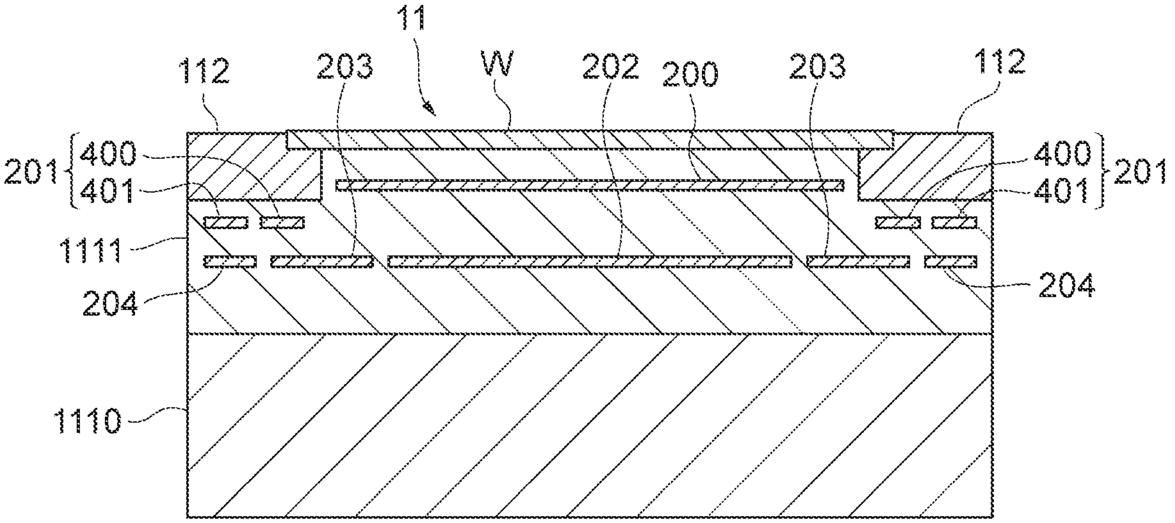
FIG. 7 is a diagram for illustrating one of other arrangement examples of the bias electrodes.

In the above embodiment, the first bias electrode 202 and the second bias electrode 203 are disposed below the substrate support surface, and the third bias electrode 204 is disposed below the ring support surface, but as illustrated in FIG. 7, the first bias electrode 202 may be disposed below the substrate support surface, the second bias electrode 203 may be disposed below the substrate support surface and the ring support surface, and the third bias electrode 204 may be disposed below the ring support surface.

Figure 8:
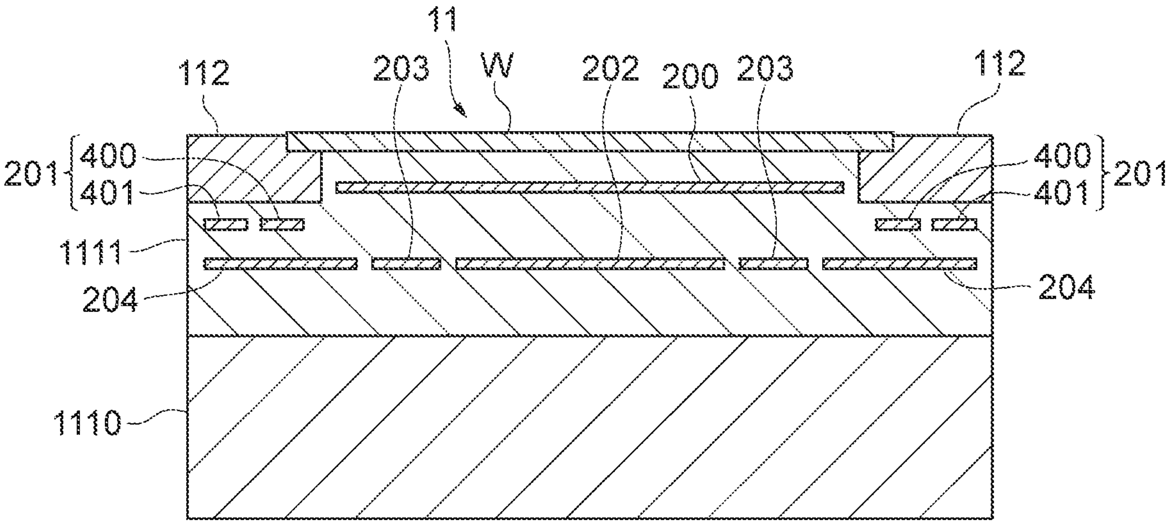
FIG. 8 is a diagram for illustrating one of other arrangement examples of the bias electrodes.
Figure 9:
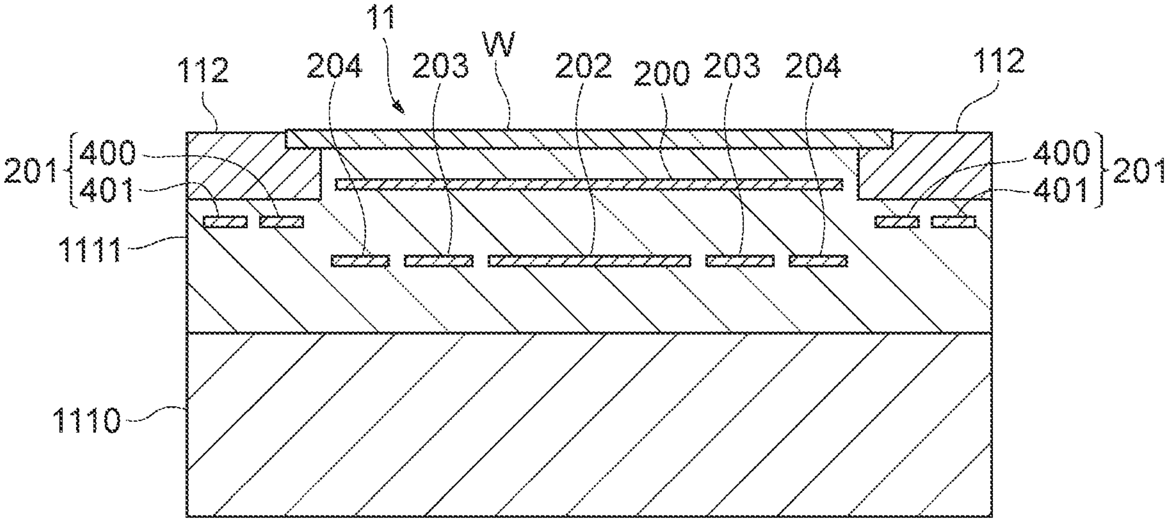
FIG. 9 is a diagram for illustrating one of other arrangement examples of the bias electrodes.

Further, as illustrated in FIG. 8, the first bias electrode 202 and the second bias electrode 203 may be disposed below the substrate support surface, and the third bias electrode 204 may be disposed below the substrate support surface and the ring support surface. Further, as illustrated in FIG. 9, the first bias electrode 202, the second bias electrode 203, and the third bias electrode 204 may be disposed below the substrate support surface.

In the above embodiment, the plasma processing apparatus 1 may also have any bias electrode other than the first to third bias electrodes 202 to 204 in the electrostatic chuck 1111. The number of bias electrodes may be four or more.

Figure 10:
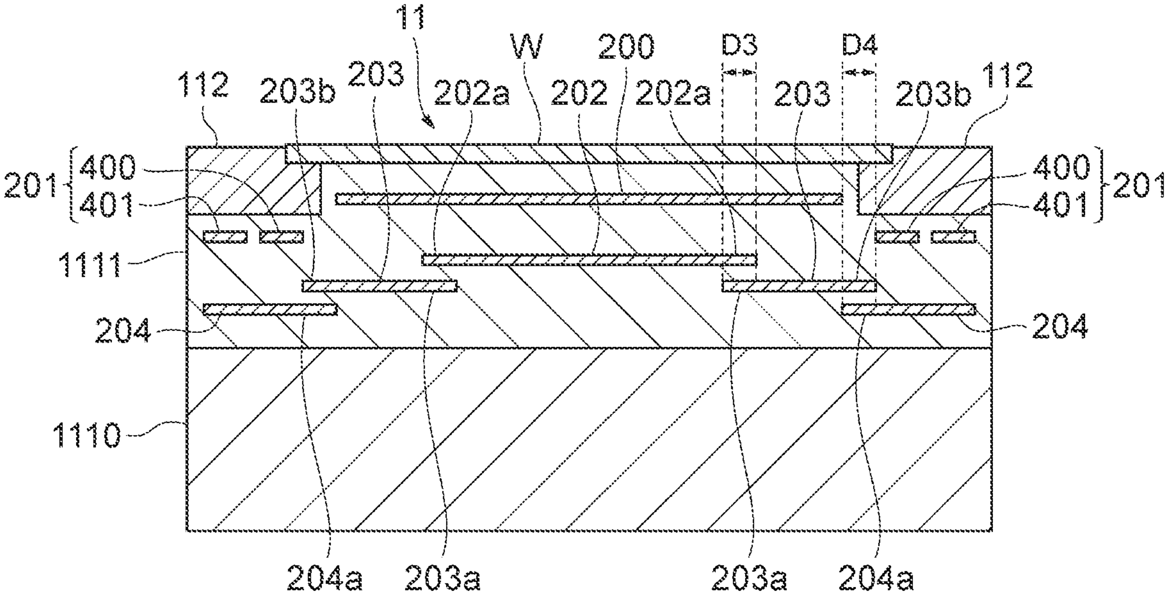
FIG. 10 is a diagram for illustrating one of other arrangement examples of the bias electrodes.

In the above embodiment, the first bias electrode 202, the second bias electrode 203, and the third bias electrode 204 may also be disposed at heights different from one another as illustrated in FIG. 10. In one embodiment, the second bias electrode 203 may be disposed in a position lower than the first bias electrode 202, and the third bias electrode 204 may be disposed in a position lower than the second bias electrode 203. In one embodiment, an outer edge area 202*a* of the first bias electrode 202 may overlap vertically with an inner edge area 203*a* of the second bias electrode 203, and an outer edge area 203*b* of the second bias electrode 203 may overlap vertically with an inner edge area 204*a* of the third bias electrode 204. Overlapping width D3 between the first bias electrode 202 and the second bias electrode 203 in the radial direction may be in a range of 9 mm to 11 mm. Overlapping width D4 between the second bias electrode 203 and the third bias electrode 204 in the radial direction may be in a range of 9 mm to 11 mm.

Note that the second bias electrode 203 may be disposed in a position higher than the first bias electrode 202, and the third bias electrode 204 may be disposed in a position higher than the second bias electrode 203.

The second bias electrode 203 may be disposed in a position higher or lower than the first bias electrode 202 and the third bias electrode 204. In this case, the first bias electrode 202 may be disposed in a position higher or lower than the third bias electrode 204, or disposed at the same height as the third bias electrode 204.

Second Exemplary Embodiment

Figure 11:
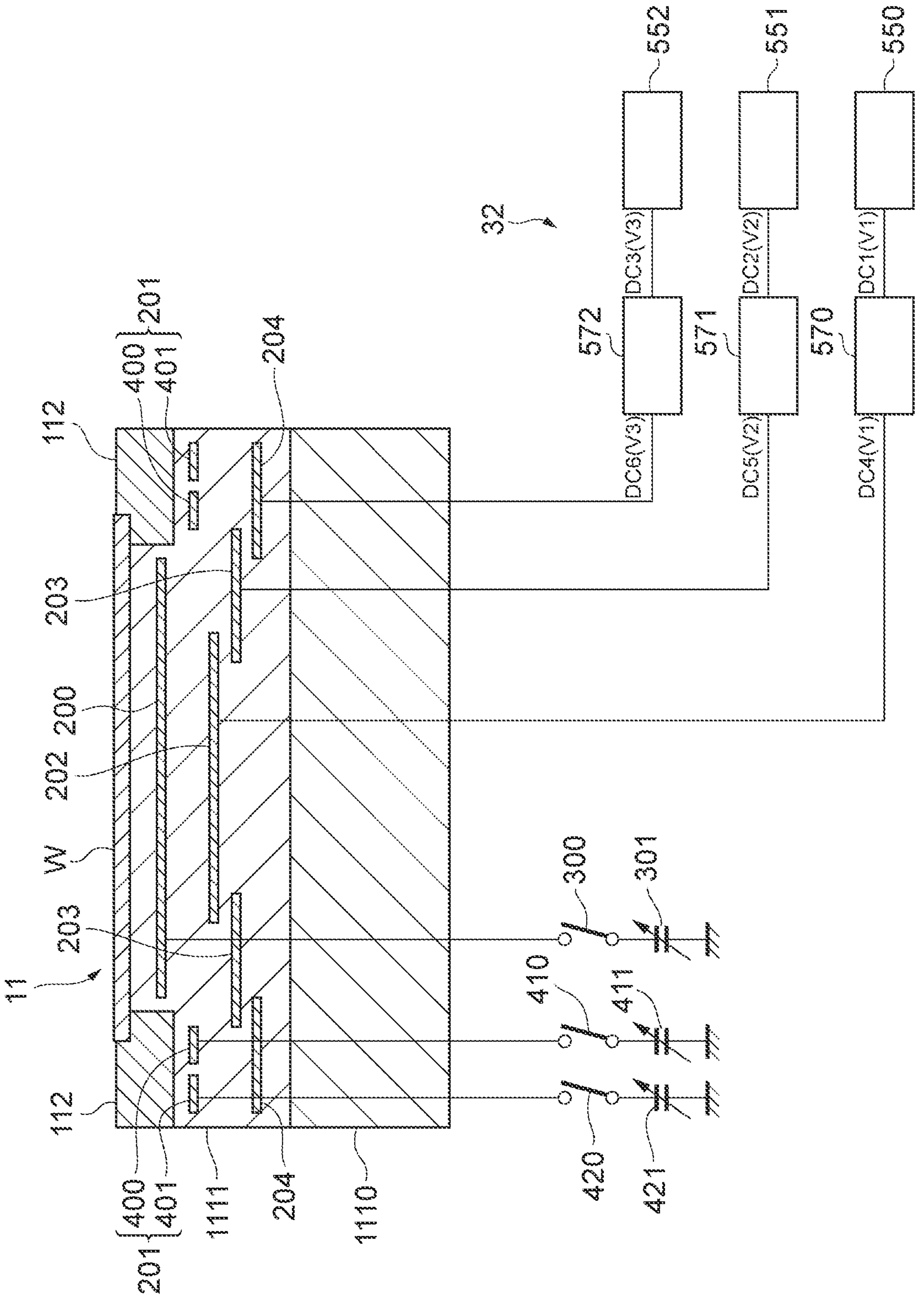
FIG. 11 is a diagram for illustrating a configuration example of the substrate support and the DC power supplies in a second exemplary embodiment.

A second exemplary embodiment of the plasma processing apparatus 1 will be described. FIG. 11 is a diagram illustrating a configuration example of the substrate support 11 and the DC power supply 32 in the second exemplary embodiment. In one embodiment, the substrate support 11 may be the same as that in the first exemplary embodiment mentioned above. In one embodiment, the first bias electrode 202, the second bias electrode 203, and the third bias electrode 204 may be disposed at heights different from one another, the second bias electrode 203 may be disposed at a position lower than the first bias electrode 202, and the third bias electrode 204 may be disposed at a position lower than the second bias electrode 203.

In one embodiment, the DC power supply 32 includes a first DC power supply 550, a second DC power supply 551, a third DC power supply 552, a first voltage pulse generator 570, a second voltage pulse generator 571, and a third voltage pulse generator 572.

The first DC power supply 550 can generate a first DC signal DC1 having a first voltage level V1. The first voltage level V1 may have negative polarity. The first DC power supply 550 may be electrically connected to the first voltage pulse generator 570. The generated first DC signal DC1 can be supplied to the first voltage pulse generator 570.

The second DC power supply 551 can generate a second DC signal DC2 having a second voltage level V2. The second voltage level V2 may have negative polarity. The second DC power supply 551 may be electrically connected to the second voltage pulse generator 571. The generated second DC signal DC2 can be supplied to the second voltage pulse generator 571.

The third DC power supply 552 can generate a third DC signal DC3 having a third voltage level V3. The third voltage level V3 may have negative polarity. The third DC power supply 552 may be electrically connected to the third voltage pulse generator 572. The generated second DC signal DC3 can be supplied to the third voltage pulse generator 572.

The first voltage pulse generator 570 can generate a first voltage pulse signal DC4 having the first voltage level V1 from the first DC signal DC1 supplied from the first DC power supply 550. The first voltage pulse signal DC4 can contain a sequence of first voltage pulses having the first voltage level V1. In one embodiment, the sequence of first voltage pulses has a pulse pattern similar to that in the example illustrated in FIG. 5. The first voltage pulse generator 570 may be electrically connected to the first bias electrode 202. The generated first voltage pulse signal DC4 can be supplied to the first bias electrode 202. A bias pulse signal based on DC voltage is generated by supplying the first voltage pulse signal DC4 to the first bias electrode 202 to make it possible to draw the ion components in the plasma formed on the substrate W of the substrate support 11 into the side of the first bias electrode 202.

The second voltage pulse generator 571 can generate a second voltage pulse signal DC5 having the second voltage level V2 from the second DC signal DC2 supplied from the second DC power supply 551. The second voltage pulse signal DC5 can contain a sequence of second voltage pulses having the second voltage level V2. In one embodiment, the sequence of second voltage pulses has a pulse pattern similar to that in the example illustrated in FIG. 5. The second voltage pulse generator 571 may be electrically connected to the second bias electrode 203. The generated second voltage pulse signal DC5 can be supplied to the second bias electrode 203. A bias pulse signal based on DC voltage is generated by supplying the second voltage pulse signal DC5 to the second bias electrode 203 to make it possible to draw the ion components in the plasma formed on the substrate W of the substrate support 11 into the side of the second bias electrode 203.

The third voltage pulse generator 572 can generate a third voltage pulse signal DC6 having the third voltage level V3 from the third DC signal DC3 supplied from the third DC power supply 552. The third voltage pulse signal DC6 can contain a sequence of third voltage pulses having the third voltage level V3. In one embodiment, the sequence of third voltage pulses has a pulse pattern similar to that in the example illustrated in FIG. 5. The third voltage pulse generator 572 may be electrically connected to the third bias electrode 204. The generated third voltage pulse signal DC6 can be supplied to the third bias electrode 204. A bias pulse signal based on DC voltage is generated by supplying the third voltage pulse signal DC6 to the third bias electrode 204 to make it possible to draw the ion components in the plasma formed on the substrate W of the substrate support 11 into the side of the third bias electrode 204. The other elements of the plasma processing apparatus 1 may be the same as those in the first exemplary embodiment mentioned above.

Upon forming the plasma, the first voltage pulse signal DC4 is supplied from the first voltage pulse generator 570 to the first bias electrode 202, the second voltage pulse signal DC5 is supplied from the second voltage pulse generator 571 to the second bias electrode 203, and the third voltage pulse signal DC6 is supplied from the third voltage pulse generator 572 to the third bias electrode 204. Thus, a bias potential based on the voltage pulses is generated in the substrate W and the ring assembly 112, and the ion components in the plasma on the substrate Ware drawn into the side of the substrate W. At this time, plasma sheath PS formed above the substrate W and the ring assembly 112 is made to get closer to the substrate W in parallel (horizontally) as illustrated in FIG. 6 by adjusting the first to third voltage levels V1 to V3 of the first to third voltage pulse signals DC4 to DC6 and applying voltage pulses based on DC voltage to the first to third bias electrodes 202 to 204, respectively. Thus, the angle at which the ion components in the plasma enter into the substrate W in the plane of the substrate W (ion incidence angle) gets closer vertically to the substrate W.

Third Exemplary Embodiment

Figure 12:
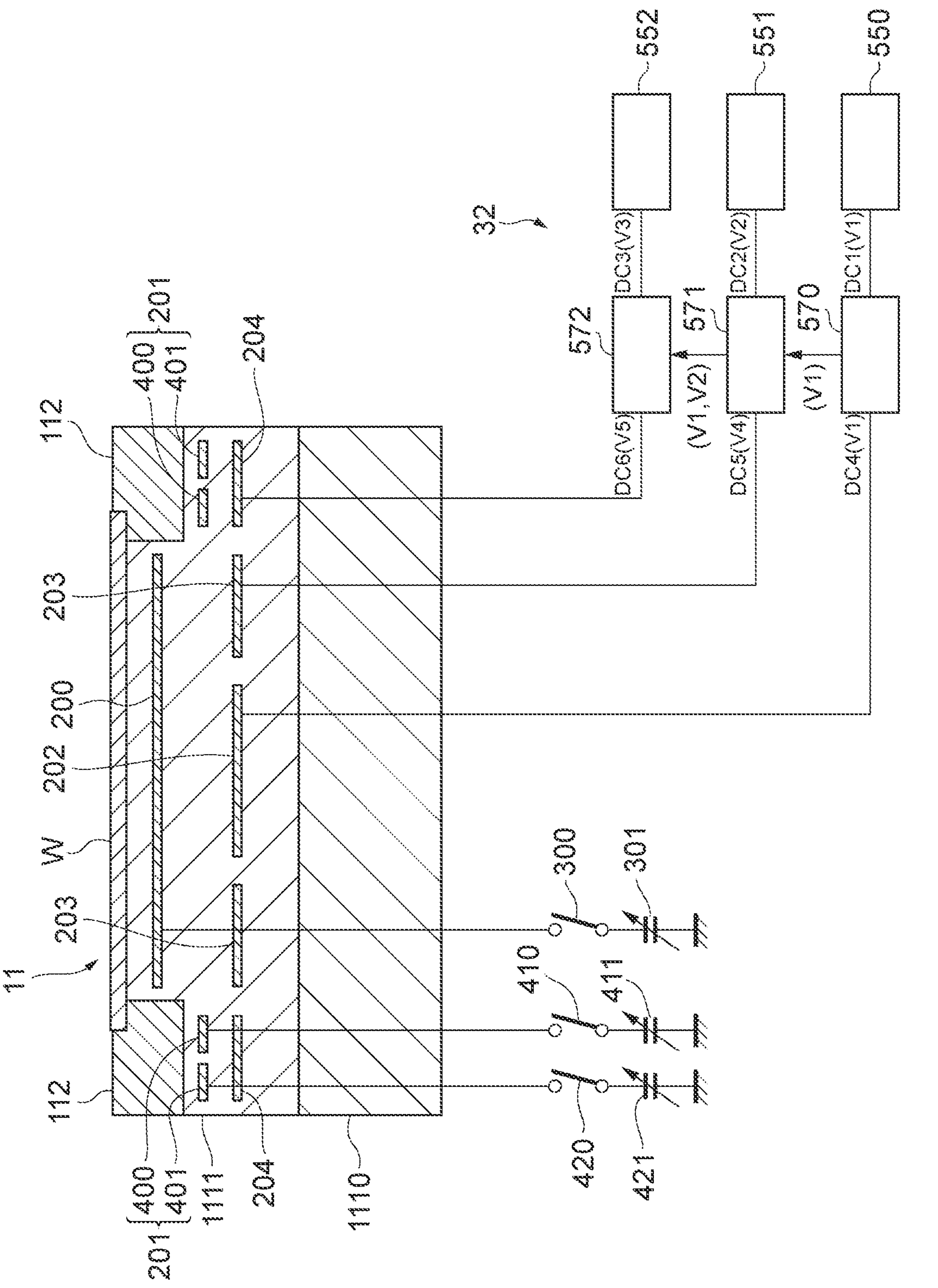
FIG. 12 is a diagram for illustrating a configuration example of the substrate support and the DC power supplies in a third exemplary embodiment.

FIG. 12 is a diagram illustrating a configuration example of the substrate support 11 and the DC power supply 32 in a third exemplary embodiment. In one embodiment, the DC power supply 32 may include the first DC power supply 550, the second DC power supply 551, the third DC power supply 552, the first voltage pulse generator 570, the second voltage pulse generator 571, and the third voltage pulse generator 572 like in the second exemplary embodiment mentioned above.

The first voltage pulse generator 570 can generate the first voltage pulse signal DC4 having the first voltage level V1. The first voltage pulse signal DC4 can contain the sequence of first voltage pulses having the first voltage level V1 In one embodiment, the sequence of first voltage pulses has a pulse pattern similar to that in the example illustrated in FIG. 5. The second voltage pulse generator 571 can generate a second voltage pulse signal DC5 having a fourth voltage level V4 derived by adding the first voltage level V1 and the second voltage level V2. The second voltage pulse signal DC5 can contain a sequence of second voltage pulses having the fourth voltage level V4. In one embodiment, the sequence of second voltage pulses has a pulse pattern similar to that in the example illustrated in FIG. 5. The third voltage pulse generator 572 can generate a third voltage pulse signal DC6 having a fifth voltage level V5 derived by adding the first voltage level V1, the second voltage level V2, and the third voltage level V3. The third voltage pulse signal DC6 can contain a sequence of third voltage pulses having the fifth voltage level V5. In one embodiment, the sequence of third voltage pulses has a pulse pattern similar to that in the example illustrated in FIG. 5. The other elements of the plasma processing apparatus 1 may be the same as those in the second exemplary embodiment or the first exemplary embodiment mentioned above.

Upon forming the plasma, the first voltage pulse signal DC4 having the first voltage level V1 is supplied from the first voltage pulse generator 570 to the first bias electrode 202, the second voltage pulse signal DC5 having the fourth voltage level V4 is supplied from the second voltage pulse generator 571 to the second bias electrode 203, and the third voltage pulse signal DC6 having the fifth voltage level V5 is supplied from the third voltage pulse generator 572 to the third bias electrode 204. Thus, a bias pulse signal based on DC voltage is generated in the substrate Wand the ring assembly 112, and the ion components in the plasma on the substrate W are drawn into the side of the substrate W. Plasma sheath PS formed above the substrate W and the ring assembly 112 is made to get closer to the substrate W in parallel (horizontally) as illustrated in FIG. 6 by applying voltage pulses based on DC voltage to the first to third bias electrodes 202 to 204, respectively. Thus, the angle at which the ion components in the plasma enter into the substrate W in the plane of the substrate W (ion incidence angle) gets closer vertically to the substrate W.

In the above embodiments, the ring chuck electrode 201 illustrated in FIG. 3 has two electrodes 400 and 401 different in polarity from each other, but the ring chuck electrode 201 may also have one monopolar electrode. The number of bias electrodes, the number of DC power supplies, and the number of voltage pulse generators are three, respectively, but the numbers may also be four or more.

According to one exemplary embodiment of the present disclosure, there can be provided a technique capable of improving in-plane uniformity of the substrate in the plasma processing.

In the above embodiments, the description is made by taking, as an example, the capacitively-coupled plasma apparatus, but it is not limited to this example, and the above embodiments may also be applied to any other plasma apparatus. For example, an inductively-coupled plasma apparatus may also be used Instead of the capacitively-coupled plasma apparatus. In this case, the inductively-coupled plasma apparatus includes an antenna and the lower electrode. The lower electrode is disposed in the substrate support, and the antenna is disposed at the top of, or above the chamber. In one embodiment, the DC power supply 32 may be electrically connected to the bias electrode disposed in the substrate support to apply a sequence of voltage pulses to the bias electrode. The RF power source 31 may be electrically connected to the antenna to supply an RF signal to the antenna.

The embodiments of the present disclosure further include the following aspects.

(Addendum 1)

A plasma processing apparatus including:

a plasma processing chamber;

a substrate support disposed in the plasma processing chamber, the substrate support including a base, an electrostatic chuck and an edge ring, the electrostatic chuck being disposed on the base and having a substrate support surface and a ring support surface, and the edge ring being disposed on the ring support surface to surround a substrate disposed on the substrate support surface;

a substrate chuck electrode disposed below the substrate support surface in the electrostatic chuck;

at least one ring chuck electrode disposed below the ring support surface in the electrostatic chuck;

a first bias electrode disposed in the electrostatic chuck and having a first outer diameter;

a second bias electrode disposed in the electrostatic chuck and having a second outer diameter greater than the first outer diameter;

a third bias electrode disposed in the electrostatic chuck and having a third outer diameter greater than the second outer diameter;

a first DC power supply configured to generate a first primary DC signal having a first primary voltage level;

a second DC power supply configured to generate a second primary DC signal having a second primary voltage level;

a third DC power supply configured to generate a third primary DC signal having a third primary voltage level;

a voltage adder configured to generate first to third secondary DC signals from the first to third primary DC signals, the first secondary DC signal having a first secondary voltage level, the second secondary DC signal having a second secondary voltage level, the third secondary DC signal having a third secondary voltage level, wherein the first secondary voltage level, the second secondary voltage level, and the third secondary voltage level are selected not to overlap one another from the first primary voltage level, a voltage level derived by adding the first primary voltage level and the second primary voltage level, and a voltage level derived by adding the first primary voltage level and the third primary voltage level;

a first voltage pulse generator electrically connected to the first bias electrode and configured to generate a first voltage pulse signal from the first secondary DC signal, the first voltage pulse signal having the first secondary voltage level;

a second voltage pulse generator electrically connected to the second bias electrode and configured to generate a second voltage pulse signal from the second secondary DC signal, the second voltage pulse signal having the second secondary voltage level; and a third voltage pulse generator electrically connected to the third bias electrode and configured to generate a third voltage pulse signal from the third secondary DC signal, the third voltage pulse signal having the third secondary voltage level.

(Addendum 2)

The plasma processing apparatus according to Addendum 1, wherein the first voltage pulse signal contains a sequence of first voltage pulses, the second voltage pulse signal, contains a sequence of second voltage pulses, and the third voltage pulse signal contains a sequence of third voltage pulses.

(Addendum 3)

The plasma processing apparatus according to Addendum 1 or 2, wherein the first primary voltage level, the second primary voltage level, and the third primary voltage level have negative polarity.

(Addendum 4)

The plasma processing apparatus according to Addendum 3, wherein the absolute value of the first primary voltage level is greater than the absolute values of the second primary voltage level and the third primary voltage level.

(Addendum 5)

The plasma processing apparatus according to any one of Addendum 1 to 4, wherein the first bias electrode is disposed to overlap vertically with the substrate support surface, the second bias electrode is disposed to overlap vertically with the substrate support surface and the ring support surface, and the third bias electrode is disposed to overlap vertically with the ring support surface.

(Addendum 6)

The plasma processing apparatus according to any one of Addendums 1 to 4, wherein the first bias electrode is disposed to overlap vertically with the substrate support surface, the second bias electrode is disposed to overlap vertically with the substrate support surface, and the third bias electrode is disposed to overlap vertically with the ring support surface.

(Addendum 7)

The plasma processing apparatus according to any one of Addendums 1 to 4, wherein the first bias electrode is disposed to overlap vertically with the substrate support surface, the second bias electrode is disposed to overlap vertically with the substrate support surface, and the third bias electrode is disposed to overlap vertically with the substrate support surface and the ring support surface.

(Addendum 8)

The plasma processing apparatus according to any one of Addendums 1 to 4, wherein the first bias electrode is disposed to overlap vertically with the substrate support surface, the second bias electrode is disposed to overlap vertically with the substrate support surface, and the third bias electrode is disposed to overlap vertically with the substrate support surface.

(Addendum 9)

The plasma processing apparatus according to any one of Addendums 1 to 8, wherein the first bias electrode, the second bias electrode, and the third bias electrode are disposed at the same height.

(Addendum 10)

The plasma processing apparatus according to any one of Addendums 1 to 8, wherein the first bias electrode, the second bias electrode, and the third bias electrode are disposed at heights different from one another.

(Addendum 11)

The plasma processing apparatus according to Addendum 10, wherein the second bias electrode is disposed at a position lower than the first bias electrode, and the third bias electrode is disposed at a position lower than the second bias electrode.

(Addendum 12)

The plasma processing apparatus according to Addendum 11, wherein an outer edge area of the first bias electrode overlaps vertically with an inner edge area of the second bias electrode, and an outer edge area of the second bias electrode overlaps vertically with an inner edge area of the third bias electrode.

(Addendum 13)

The plasma processing apparatus according to any one of Addendums 1 to 12, wherein the ring chuck electrode includes an inner ring chuck electrode to which a first ring chuck voltage having a first polarity is applied, and an outer ring chuck electrode to which a second ring chuck voltage having a second polarity is applied.

(Addendum 14)

A plasma processing apparatus including:

a plasma processing chamber;

a substrate support disposed in the plasma processing chamber, the substrate support including a base, an electrostatic chuck and an edge ring, the electrostatic chuck being disposed on the base and having a substrate support surface and a ring support surface, and the edge ring being disposed on the ring support surface to surround a substrate on the substrate support surface;

a substrate chuck electrode disposed below the substrate support surface in the electrostatic chuck;

at least one ring chuck electrode disposed below the ring support surface in the electrostatic chuck;

a first bias electrode disposed in the electrostatic chuck and having a first outer diameter;

a second bias electrode disposed in the electrostatic chuck and having a second outer diameter greater than the first outer diameter;

a third bias electrode disposed in the electrostatic chuck and having a third outer diameter greater than the second outer diameter;

a first voltage pulse generator electrically connected to the first bias electrode and configured to generate a first voltage pulse signal having a first voltage level;

a second voltage pulse generator electrically connected to the second bias electrode and configured to generate a second voltage pulse signal having a second voltage level; and a third voltage pulse generator electrically connected to the third bias electrode and configured to generate a third voltage pulse signal having a third voltage level.

(Addendum 15)

The plasma processing apparatus according to Addendum 14, further including:

a first DC power supply configured to supply a first DC signal having the first voltage level to the first voltage pulse generator;

a second DC power supply configured to supply a second DC signal having the second voltage level to the second voltage pulse generator; and a third DC power supply configured to supply a third DC signal having the third voltage level to the third voltage pulse generator.

(Addendum 16)

The plasma processing apparatus according to Addendum 14 or Addendum 15, wherein the first voltage level, the second voltage level, and the third voltage level have negative polarity.

(Addendum 17)

The plasma processing apparatus according to any one of Addendums 14 to 16, wherein the first bias electrode is disposed to overlap vertically with the substrate support surface, the second bias electrode is disposed to overlap vertically with the substrate support surface, and the third bias electrode is disposed to overlap vertically with the ring support surface.

(Addendum 18)

The plasma processing apparatus according to Addendum 17, wherein the second bias electrode is disposed at a position lower than the first bias electrode, and the third bias electrode is disposed at a position lower than the second bias electrode.

(Addendum 19)

The plasma processing apparatus according to Addendum 18, wherein an outer edge area of the first bias electrode overlaps vertically with an inner edge area of the second bias electrode, and an outer edge area of the second bias electrode overlaps vertically with an inner edge area of the third bias electrode.

(Addendum 20)

A plasma processing apparatus including:

a plasma processing chamber;

a substrate support disposed in the plasma processing chamber, the substrate support including a base, an electrostatic chuck and an edge ring, the electrostatic chuck being disposed on the base and having a substrate support surface and a ring support surface, and the edge ring being disposed on the ring support surface to surround a substrate disposed on the substrate support surface;

a substrate chuck electrode disposed below the substrate support surface in the electrostatic chuck;

at least one ring chuck electrode disposed below the ring support surface in the electrostatic chuck;

a first bias electrode disposed in the electrostatic chuck and having a first outer diameter;

a second bias electrode disposed in the electrostatic chuck and having a second outer diameter greater than the first outer diameter;

a third bias electrode disposed in the electrostatic chuck and having a third outer diameter greater than the second outer diameter;

a first DC power supply configured to generate a first DC signal having a first voltage level;

a second DC power supply configured to generate a second DC signal having a second voltage level;

a third DC power supply configured to generate a third DC signal having a third voltage level;

a first voltage pulse generator electrically connected to the first bias electrode and configured to generate a first voltage pulse signal having the first voltage level;

a second voltage pulse generator electrically connected to the second bias electrode and configured to generate a second voltage pulse signal having a fourth voltage level, the fourth voltage level being a sum of the first voltage level and the second voltage level; and a third voltage pulse generator electrically connected to the third bias electrode and configured to generate a third voltage pulse signal having a fifth voltage level, the fifth voltage level being a sum of the first voltage level, the second voltage level, and the third voltage level.

the respective embodiments mentioned above are described for illustrative purposes, and are not intended to limit the scope of the present disclosure. Each of the above embodiments can be modified in various ways without departing from the scope and spirit of the present disclosure. For example, some elements in a certain embodiment can be added to any other embodiment. Further, some elements in a certain embodiment can be replaced with corresponding elements in any other embodiment.

What is claimed is:

1. A plasma processing apparatus comprising:

a plasma processing chamber;

a substrate support disposed in the plasma processing chamber, the substrate support including a base, an electrostatic chuck and an edge ring, the electrostatic chuck being disposed on the base and having a substrate support surface and a ring support surface, and the edge ring being disposed on the ring support surface to surround a substrate disposed on the substrate support surface;

a substrate chuck electrode disposed below the substrate support surface in the electrostatic chuck;

at least one ring chuck electrode disposed below the ring support surface in the electrostatic chuck;

a first bias electrode disposed in the electrostatic chuck and having a first outer diameter;

a second bias electrode disposed in the electrostatic chuck and having a second outer diameter greater than the first outer diameter;

a third bias electrode disposed in the electrostatic chuck and having a third outer diameter greater than the second outer diameter;

a first DC power supply configured to generate a first primary DC signal having a first primary voltage level;

a second DC power supply configured to generate a second primary DC signal having a second primary voltage level;

a third DC power supply configured to generate a third primary DC signal having a third primary voltage level;

a voltage adder configured to generate first to third secondary DC signals from the first to third primary DC signals, the first secondary DC signal having a first secondary voltage level, the second secondary DC signal having a second secondary voltage level, the third secondary DC signal having a third secondary voltage level, wherein the first secondary voltage level, the second secondary voltage level and the third secondary voltage level are selected not to overlap one another from the first primary voltage level, a voltage level derived by adding the first primary voltage level and the second primary voltage level, and a voltage level derived by adding the first primary voltage level and the third primary voltage level;

a first voltage pulse generator electrically connected to the first bias electrode and configured to generate a first voltage pulse signal from the first secondary DC signal, the first voltage pulse signal having the first secondary voltage level;

a second voltage pulse generator electrically connected to the second bias electrode and configured to generate a second voltage pulse signal from the second secondary DC signal, the second voltage pulse signal having the second secondary voltage level; and a third voltage pulse generator electrically connected to the third bias electrode and configured to generate a third voltage pulse signal from the third secondary DC signal, the third voltage pulse signal having the third secondary voltage level.

2. The plasma processing apparatus according to claim 1, wherein the first voltage pulse signal contains a sequence of first voltage pulses, the second voltage pulse signal contains a sequence of second voltage pulses, and the third voltage pulse signal contains a sequence of third voltage pulses.

3. The plasma processing apparatus according to claim 1, wherein the first primary voltage level, the second primary voltage level, and the third primary voltage level have negative polarity.

4. The plasma processing apparatus according to claim 3, wherein an absolute value of the first primary voltage level is greater than absolute values of the second primary voltage level and the third primary voltage level.

5. The plasma processing apparatus according to claim 1, wherein the first bias electrode is disposed to vertically overlap with the substrate support surface, the second bias electrode is disposed to vertically overlap with the substrate support surface and the ring support surface, and the third bias electrode is disposed to vertically overlap with the ring support surface.

6. The plasma processing apparatus according to claim 1, wherein the first bias electrode is disposed to vertically overlap with the substrate support surface, the second bias electrode is disposed to vertically overlap with the substrate support surface, and the third bias electrode is disposed to vertically overlap with the ring support surface.

7. The plasma processing apparatus according to claim 1, wherein the first bias electrode is disposed to vertically overlap with the substrate support surface, the second bias electrode is disposed to vertically overlap with the substrate support surface, and the third bias electrode is disposed to vertically overlap with the substrate support surface and the ring support surface.

8. The plasma processing apparatus according to claim 1, wherein the first bias electrode is disposed to vertically overlap with the substrate support surface, the second bias electrode is disposed to vertically overlap with the substrate support surface, and the third bias electrode is disposed to vertically overlap with the substrate support surface.

9. The plasma processing apparatus according to claim 1, wherein the first bias electrode, the second bias electrode, and the third bias electrode are disposed at the same height.

10. The plasma processing apparatus according to claim 1, wherein the first bias electrode, the second bias electrode, and the third bias electrode are disposed at heights different from one another.

11. The plasma processing apparatus according to claim 10, wherein the second bias electrode is disposed at a position lower than the first bias electrode, and the third bias electrode is disposed at a position lower than the second bias electrode.

12. The plasma processing apparatus according to claim 11, wherein an outer edge area of the first bias electrode vertically overlaps with an inner edge area of the second bias electrode, and an outer edge area of the second bias electrode vertically overlaps with an inner edge area of the third bias electrode.

13. The plasma processing apparatus according to claim 1, wherein the ring chuck electrode includes an inner ring chuck electrode to which a first ring chuck voltage having a first polarity is applied, and an outer ring chuck electrode to which a second ring chuck voltage having a second polarity is applied.

14. A plasma processing apparatus comprising:

a plasma processing chamber;

a substrate support disposed in the plasma processing chamber, the substrate support including a base, an electrostatic chuck and an edge ring, the electrostatic chuck being disposed on the base and having a substrate support surface and a ring support surface, and the edge ring being disposed on the ring support surface to surround a substrate disposed on the substrate support surface;

a substrate chuck electrode disposed below the substrate support surface in the electrostatic chuck;

at least one ring chuck electrode disposed below the ring support surface in the electrostatic chuck;

a first bias electrode disposed in the electrostatic chuck and having a first outer diameter;

a second bias electrode disposed in the electrostatic chuck and having a second outer diameter greater than the first outer diameter;

a third bias electrode disposed in the electrostatic chuck and having a third outer diameter greater than the second outer diameter;

a first DC power supply configured to generate a first DC signal having a first voltage level;

a second DC power supply configured to generate a second DC signal having a second voltage level;

a third DC power supply configured to generate a third DC signal having a third voltage level;

a first voltage pulse generator electrically connected to the first bias electrode and configured to generate a first voltage pulse signal having the first voltage level;

a second voltage pulse generator electrically connected to the second bias electrode and configured to generate a second voltage pulse signal having a fourth voltage level, the fourth voltage level being a sum of the first voltage level and the second voltage level; and a third voltage pulse generator electrically connected to the third bias electrode and configured to generate a third voltage pulse signal having a fifth voltage level, the fifth voltage level being a sum of the first voltage level, the second voltage level, and the third voltage level.

* * * * *